United States Patent
Sasaki et al.

(10) Patent No.: US 8,907,454 B2
(45) Date of Patent: Dec. 9, 2014

(54) TRANSISTOR WITH HEAT SINK JOINED TO ONLY PART OF ONE ELECTRODE

(71) Applicants: Yoshinobu Sasaki, Tokyo (JP); Hitoshi Kurusu, Tokyo (JP)

(72) Inventors: Yoshinobu Sasaki, Tokyo (JP); Hitoshi Kurusu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/763,798

(22) Filed: Feb. 11, 2013

(65) Prior Publication Data

US 2013/0264682 A1 Oct. 10, 2013

(30) Foreign Application Priority Data

Apr. 4, 2012 (JP) ................... 2012-085642

(51) Int. Cl.
- *H01L 27/102* (2006.01)
- *H01L 27/04* (2006.01)
- *H01L 29/73* (2006.01)

(52) U.S. Cl.
CPC ............... *H01L 27/04* (2013.01); *H01L 29/73* (2013.01)
USPC ............................ 257/587; 257/573; 257/584

(58) Field of Classification Search
USPC ......... 257/560, 561, 563, 564, 573, 583, 584, 257/587
See application file for complete search history.

(56) References Cited

U.S. PATENT DOCUMENTS

| 6,633,075 B1 * | 10/2003 | Shirakawa ................... 257/565 |
| 6,861,906 B2 | 3/2005 | Mori et al. |
| 7,622,756 B2 * | 11/2009 | Sasaki et al. .................. 257/205 |

FOREIGN PATENT DOCUMENTS

| JP | 7-283235 A | 10/1995 |
| JP | 7-335673 A | 12/1995 |
| WO | WO 02/056461 A1 | 7/2002 |

OTHER PUBLICATIONS

Korean Patent Office; Office Action in corresponding Korean Patent Application No. 10-2013-0030100 (May 23, 2014).

* cited by examiner

*Primary Examiner* — Matthew E Warren
(74) *Attorney, Agent, or Firm* — Leydig, Voit & Mayer, Ltd.

(57) ABSTRACT

A transistor includes: a semiconductor substrate; a first electrode on the semiconductor substrate and having first and second portions; a second electrode on the semiconductor substrate and spaced apart from the first electrode; a control electrode on the semiconductor substrate and disposed between the first electrode and the second electrode; and a first heat sink plate joined to the second portion of the first electrode without being joined to the first portion of the first electrode.

12 Claims, 7 Drawing Sheets

EFFECTIVE TRANSISTOR SIZE

US 8,907,454 B2

TRANSISTOR WITH HEAT SINK JOINED TO ONLY PART OF ONE ELECTRODE

BACKGROUND OF THE INVENTION

1. Field of the Invention

The present invention relates to a transistor used in a power amplifier module incorporated in a portable telephone terminal or the like.

2. Background Art

It is known that a deterioration in characteristics of a transistor is caused by an increase in temperature of the transistor during operation (see, for example, Japanese Patent Laid-Open No. 7-335673). FIG. 15 is a diagram showing the relationship between the collector current and the collector voltage of a conventional transistor. In FIG. 15, point A indicates a current with a normal bias applied. With increase in collector voltage, the current increases abruptly at point B. This is due to thermal runaway caused by the increased junction temperature of the transistor. With a further increase in the applied voltage, the transistor is broken by heat at point C.

SUMMARY OF THE INVENTION

There has been a problem that when a high voltage is applied to a transistor, the transistor is broken by increased heat in the transistor. Also, if a resistor is connected to the emitter or the base of the transistor for the purpose of preventing breakdown, the amplification characteristic degrades.

In view of the above-described problems, an object of the present invention is to provide a transistor which can prevent breakdown caused by high applied voltage.

According to the present invention, a transistor includes: a semiconductor substrate; a first electrode on the semiconductor substrate and having first and second portions; a second electrode on the semiconductor substrate and spaced apart from the first electrode; a control electrode on the semiconductor substrate and disposed between the first electrode and the second electrode; and a first heat sink plate joined to the second portion without being joined to the first portion of the first electrode.

The present invention makes it possible to prevent breakdown caused by high applied voltage.

Other and further objects, features and advantages of the invention will appear more fully from the following description.

DETAILED DESCRIPTION OF THE PREFERRED EMBODIMENTS

A transistor according to the embodiments of the present invention will be described with reference to the drawings. The same components will be denoted by the same symbols, and the repeated description thereof may be omitted.

First Embodiment

Figure 1:
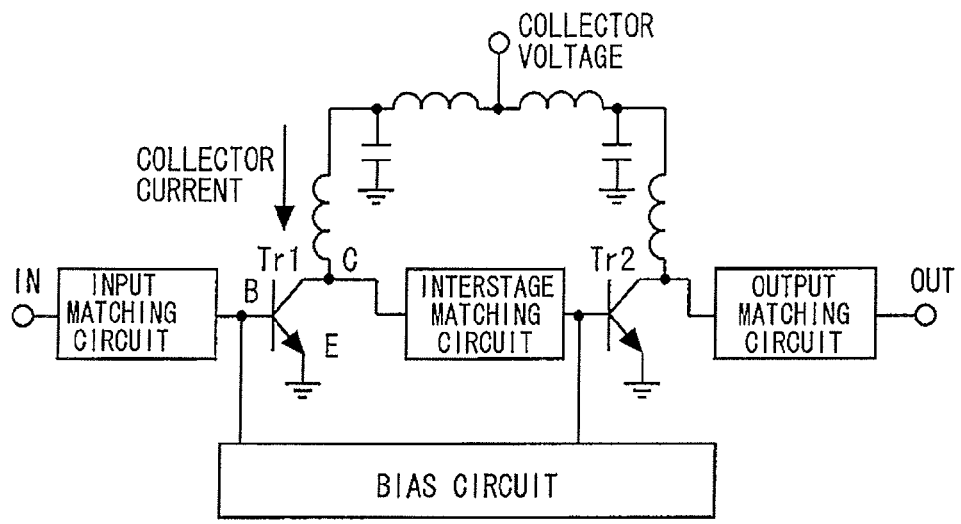
FIG. 1 is a circuit diagram showing a power amplifier module according to a first embodiment of the present invention.

FIG. 1 is a circuit diagram showing a power amplifier module according to a first embodiment of the present invention. This power amplifier module is incorporated in a portable telephone terminal or the like. An RF signal input through an input terminal IN is amplified by an initial-stage transistor Tr1 and a rear-stage transistor Tr2 to be output through an output terminal Out. The amplifier module is not limited to the illustrated two-stage amplifier; it may be a multi-stage amplifier having two or more amplification stages.

A bias circuit supplies base currents to bases B of the initial-stage transistor Tr1 and the rear-stage transistor Tr2. An input matching circuit is provided on the input side of the initial-stage transistor Tr1. An interstage matching circuit is provided between the initial-stage transistor Tr1 and the rear-stage transistor Tr2. An output matching circuit is provided on the output side of the rear-stage transistor Tr2.

A collector voltage of about 3.4 V is applied to collectors C of the initial-stage transistor Tr1 and the rear-stage transistor Tr2. In some case, the collector voltage is directly supplied from a battery. The collector voltage is not constant, and a voltage of about 6 V may occasionally be applied to the collectors. There is a need to prevent malfunction of the amplifier module even when such a high voltage is applied.

Figure 2:
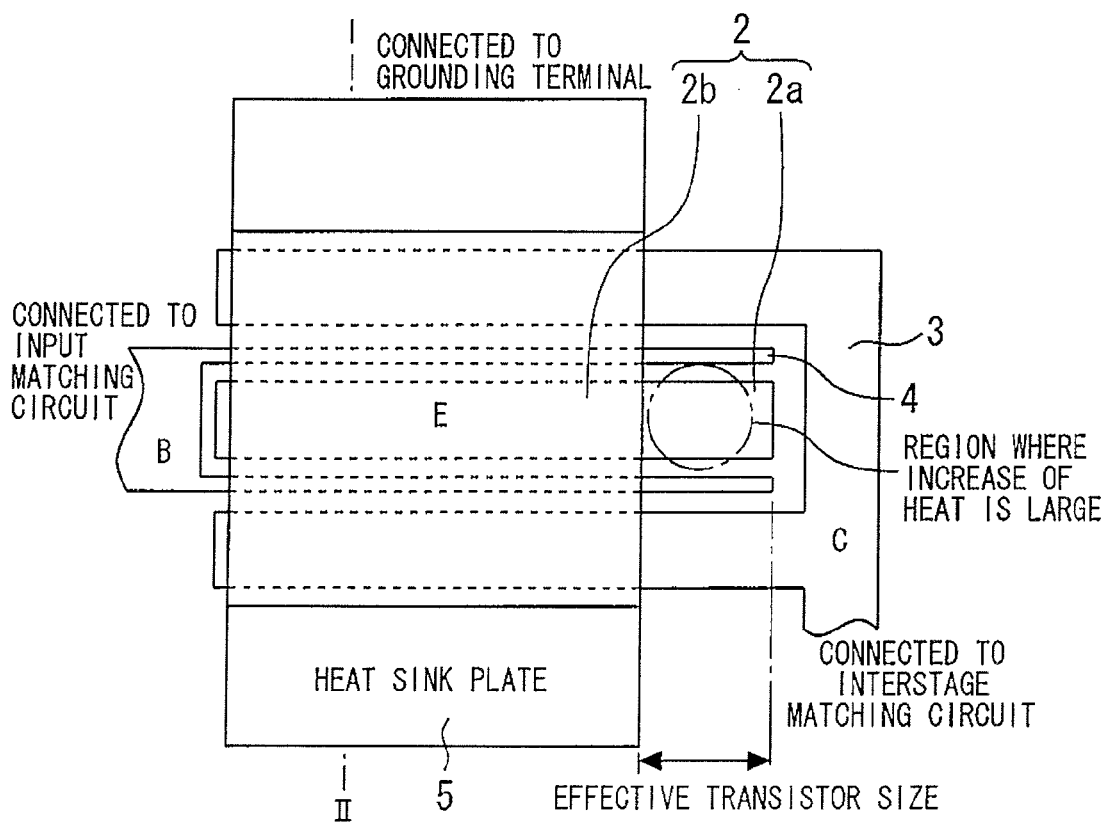
FIG. 2 is a top view of a transistor according to the first embodiment of the present invention.
Figure 3:
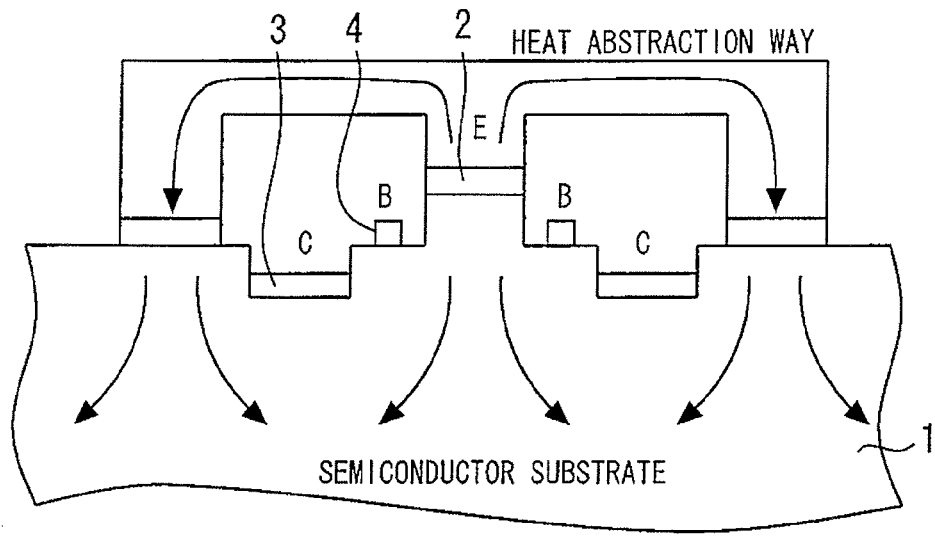
FIG. 3 is a sectional view taken along line I-II in FIG. 2.

FIG. 2 is a top view of a transistor according to the first embodiment of the present invention. FIG. 3 is a sectional view taken along line I-II in FIG. 2. This transistor is the initial-stage transistor Tr1 shown in FIG. 1.

An emitter electrode 2, a collector electrode 3 and a base electrode 4 are disposed on a semiconductor substrate 1. The collector electrode 3 is spaced apart from the emitter electrode 2. The base electrode 4 is disposed between the emitter electrode 2 and the collector electrode 3. The base electrode 4 is connected to the input matching circuit; the emitter electrode 2 to a grounding terminal of the amplifier module; and the collector electrode 3 to the interstage matching circuit. The number of transistor fingers is not limited to one. A plurality of fingers may be disposed parallel to each other.

The emitter electrode 2 has portions 2a and 2b. A heat sink plate 5 is joined to the portion 2b of the emitter electrode 2 without being joined to the portion 2a of the emitter electrode 2. The heat sink plate 5 is joined to the semiconductor substrate 1 outside the region where the emitter electrode 2, the collector electrode 3 and the base electrode 4 exist. The heat sink plate 5 is made of a metal such as gold having high thermal conductivity and transfers heat from the emitter electrode 2 to the semiconductor substrate 1. At the portion 2a to which the heat sink plate 5 is not joined, increase of heat can occur comparatively easily.

Because of the larger increase of heat at the portion 2a, the temperature is locally increased at the portion 2a. Therefore the collector current density in the corresponding region is increased, while the collector current density in the other region is reduced. In the region where the increase of heat is large, the current density is high and, therefore, a further increased current flows. In the other region, only a small current flows. A thermal-runaway region is thus provided intentionally in a portion of the transistor to reduce the effective transistor size, thereby limiting the current flowing through the entire transistor after the occurrence of thermal runaway. The breakdown voltage can therefore be increased.

Figure 4:
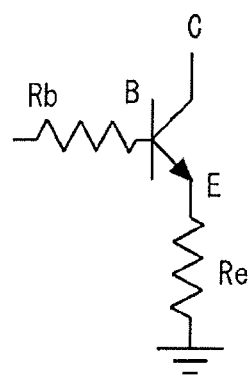
FIG. 4 is a diagram showing an equivalent circuit of the transistor according to the first embodiment of the present invention at the time of thermal runaway.

FIG. 4 is a diagram showing an equivalent circuit of the transistor according to the first embodiment of the present invention at the time of thermal runaway. During thermal runaway, since the current in the region having a low thermal resistance is limited, parasitic resistances Rb and Re are produced in the base B and the emitter E of the transistor, respectively. These parasitic resistances further limit the thermal runaway current, so that the breakdown voltage can be increased.

Figure 5:
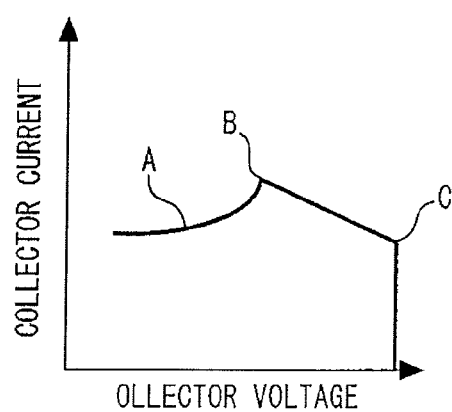
FIG. 5 is a diagram showing the relationship between the collector current and the collector voltage in the transistor according to the first embodiment of the present invention.

FIG. 5 is a diagram showing the relationship between the collector current and the collector voltage in the transistor according to the first embodiment of the present invention. From FIG. 5, it can be understood that the voltage (point B) at which thermal runaway starts is the same as that in the conventional transistor but the peak current is limited. The breakdown voltage (point C) can therefore be increased.

The portion 2a at which the increase of heat is large is provided at an end portion of the emitter electrode 2. Because the thermal resistance of the end portion of the transistor finger is lower than that of a central portion, the voltage at which thermal runaway occurs can be reduced.

Second Embodiment

Figure 6:
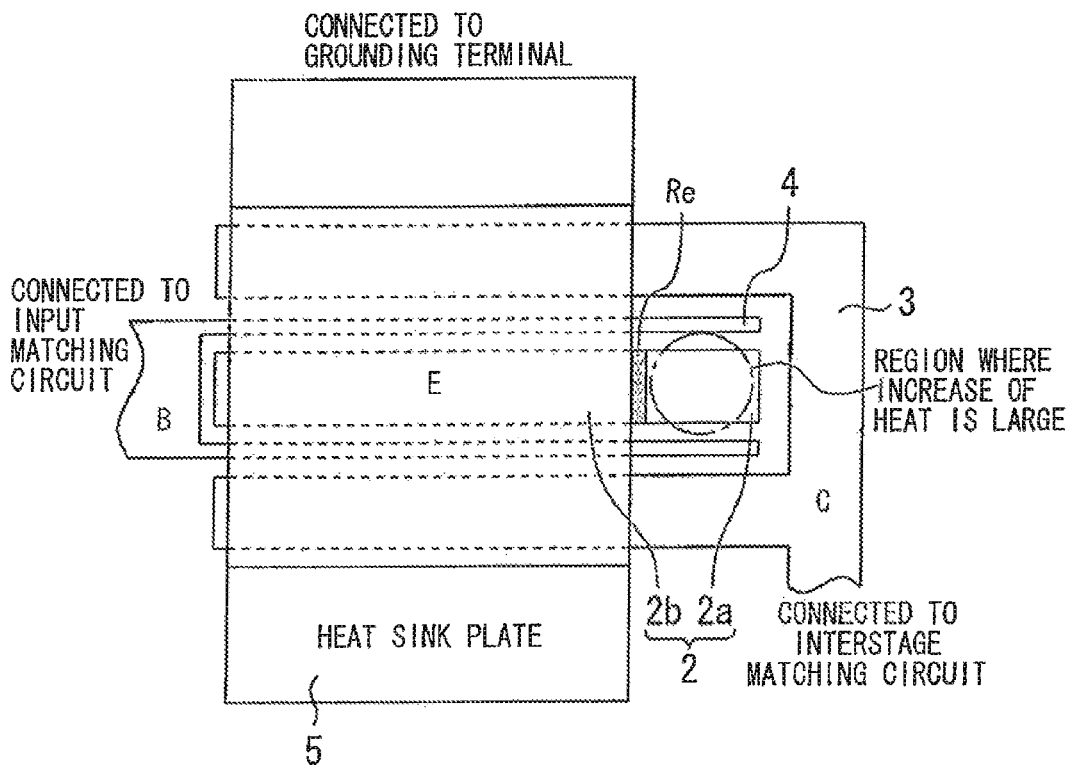
FIG. 6 is a top view showing a transistor according to a second embodiment of the present invention.

FIG. 6 is a top view showing a transistor according to a second embodiment of the present invention. A resistance Re is provided between the portion 2a of the emitter electrode 2 at which the increase of heat is large and the portion 2b of the emitter electrode 2 at which the increase of heat is small. By this resistance Re, the collector current can be limited to a low value even when heat in the transistor is increased. The breakdown voltage can therefore be increased.

Figure 7:
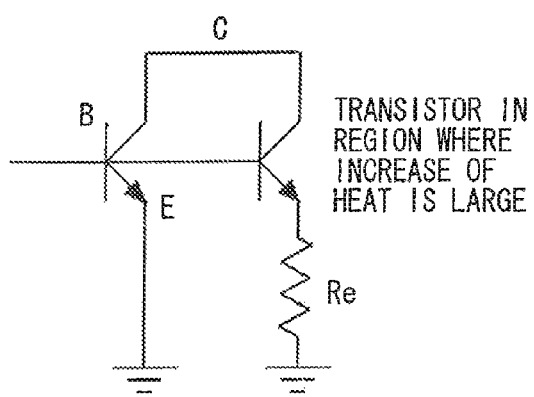
FIG. 7 is a diagram showing an equivalent circuit of the transistor according to the second embodiment of the present invention at the time of thermal runaway.

FIG. 7 is a diagram showing an equivalent circuit of the transistor according to the second embodiment of the present invention at the time of thermal runaway. During normal operation, since the resistance Re acts on the transistor in the high-thermal-resistance region, the amplification characteristic does not degrade substantially. On the other hand, at the time of thermal runaway, mainly the transistor in the high-thermal-resistance region operates, so that the effect of the resistance Re is large and the resistance Re limits the increase in current. The breakdown voltage can therefore be increased.

Third Embodiment

Figure 8:
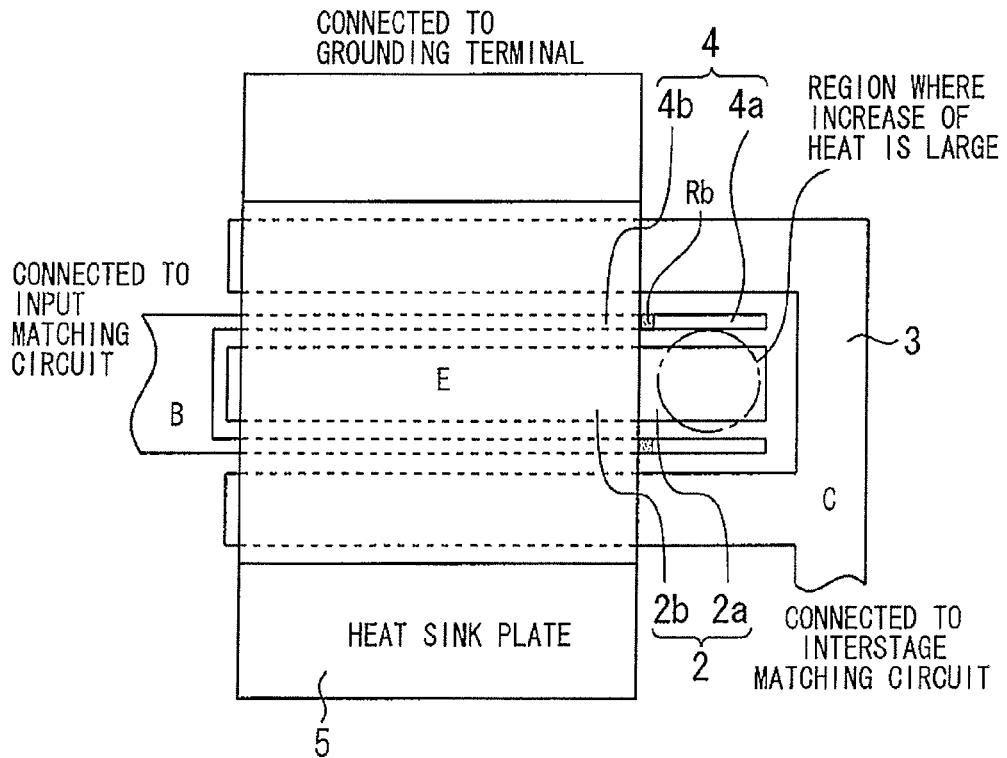
FIG. 8 is a top view showing a transistor according to a third embodiment of the present invention.

FIG. 8 is a top view showing a transistor according to a third embodiment of the present invention. The base electrode 4 has portions 4a opposite to the portion 2a of the emitter electrode 2 and portions 4b opposed to the portion 2b of the emitter electrode 2. A resistance Rb is provided between the portions 4a of the base electrode 4 at which the increase of heat is large and the portions 4b of the base electrode 4 at which the increase of heat is small. By this resistance Rb, the collector current can be limited to a low value even when heat in the transistor is increased. The breakdown voltage can therefore be increased.

Figure 9:
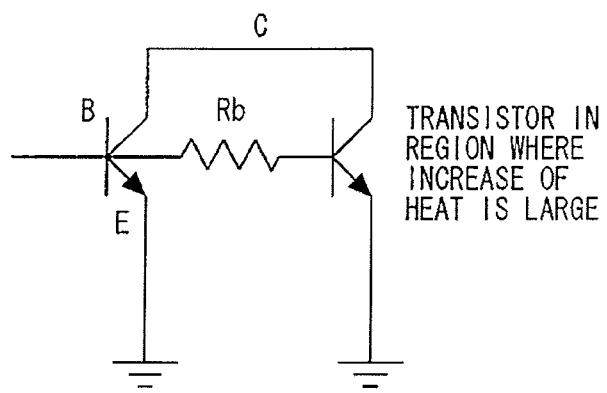
FIG. 9 is a diagram showing an equivalent circuit of the transistor according to the third embodiment of the present invention at the time of thermal runaway.

FIG. 9 is a diagram showing an equivalent circuit of the transistor according to the third embodiment of the present invention at the time of thermal runaway. During normal operation, since the resistance Rb acts on the transistor in the high-thermal-resistance region, the amplification characteristic does not degrade substantially. On the other hand, at the time of thermal runaway, mainly the transistor in the high-thermal-resistance region operates, so that the effect of the resistance Rb is large and the resistance Rb limits the increase in current. The breakdown voltage can therefore be increased.

Fourth Embodiment

Figure 10:
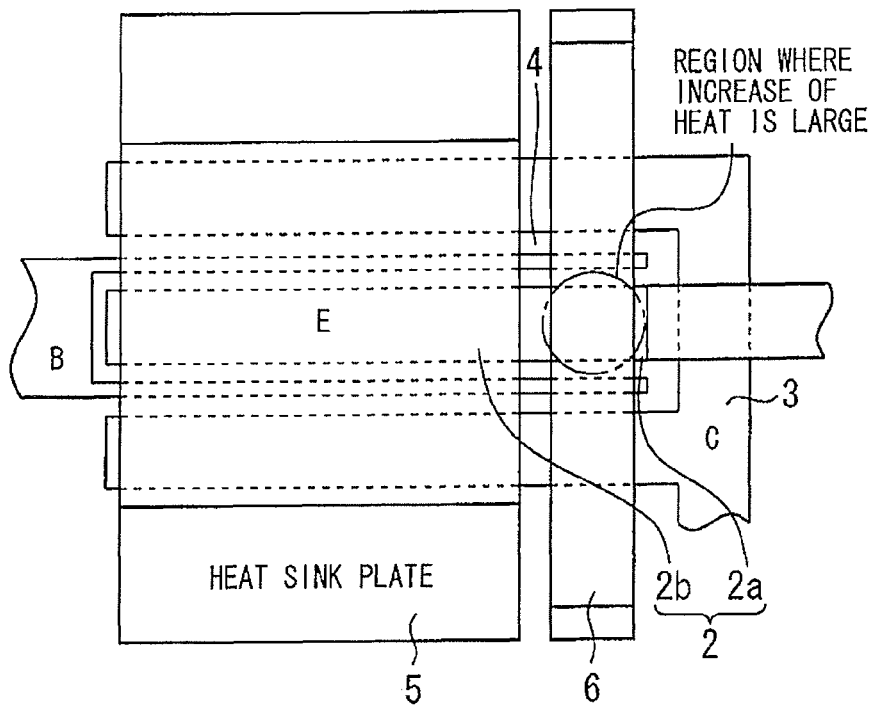
FIG. 10 is a top view showing a transistor according to a fourth embodiment of the present invention.

FIG. 10 is a top view showing a transistor according to a fourth embodiment of the present invention. A heat sink plate 6 is joined to the portion 2a of the emitter electrode 2 without being joined to the portion 2a of the emitter electrode 2. The heat-releasing performance of the heat sink plate 6 is lower than that of the heat sink plate 5. In this way, separate heat-releasing structures are provided on the region where the increase of heat is large and the region where the increase of heat is small. Adjustment of the difference between the rates of increase of heat in the two regions is enabled, so that the voltage at which thermal runway starts and the breakdown voltage can be adjusted. Also, since the high-thermal-resistance region is also provided with the heat-releasing structure, breakdown of the transistor does not occur after the occurrence of thermal runaway.

Fifth Embodiment

Figure 11:
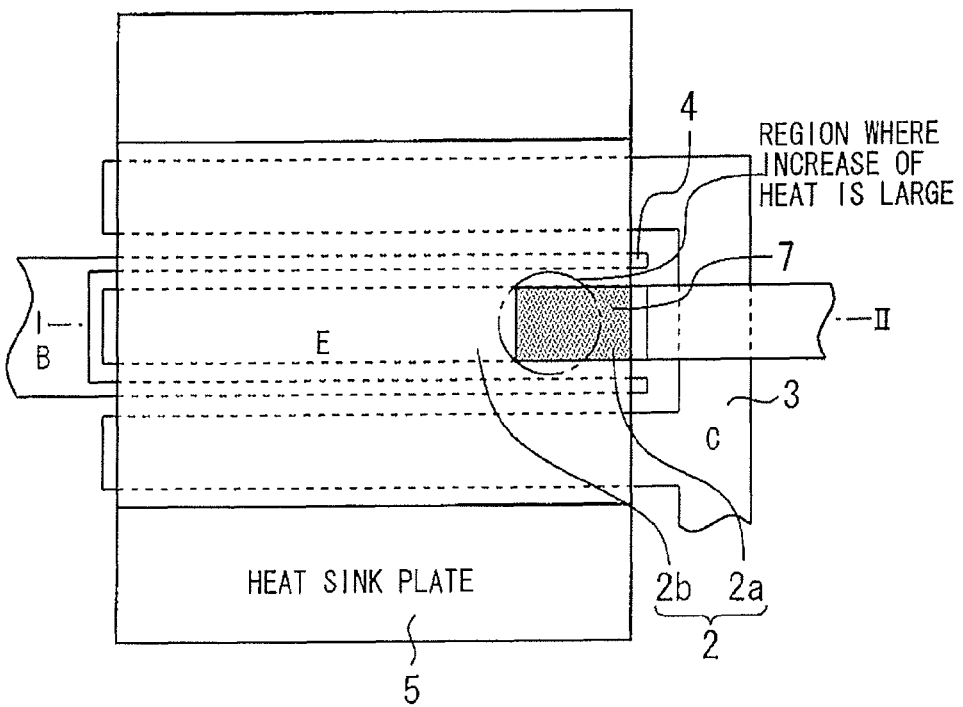
FIG. 11 is a top view showing a transistor according to a fifth embodiment of the present invention.
Figure 12:
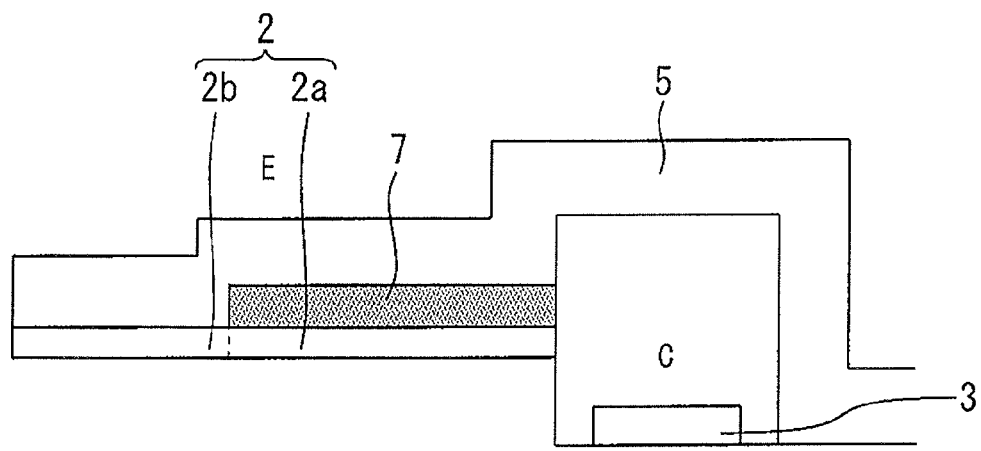
FIG. 12 is a sectional view taken along line I-II in FIG. 11.

FIG. 11 is a top view showing a transistor according to a fifth embodiment of the present invention. FIG. 12 is a sectional view taken along line I-II in FIG. 11. The heat sink plate 5 is provided on the entire surface of the emitter electrode 2, and a high-thermal-resistance film 7 is provided between the portion 2a of the emitter electrode 2 and the heat sink plate 5. The high-thermal-resistance film 7 has a thermal resistance higher than that of both the emitter electrode 2 and the heat sink plate 5. The same effect as that of the first embodiment can be obtained thereby. Moreover, since only the high-thermal-resistance film 7 is added by being inserted, the structure is simplified. Also, the rate of increase of heat can be adjusted by adjusting the material and thickness of the high-thermal-resistance film 7, so that the voltage at which thermal runway starts and the breakdown voltage can be adjusted.

Sixth Embodiment

Figure 13:
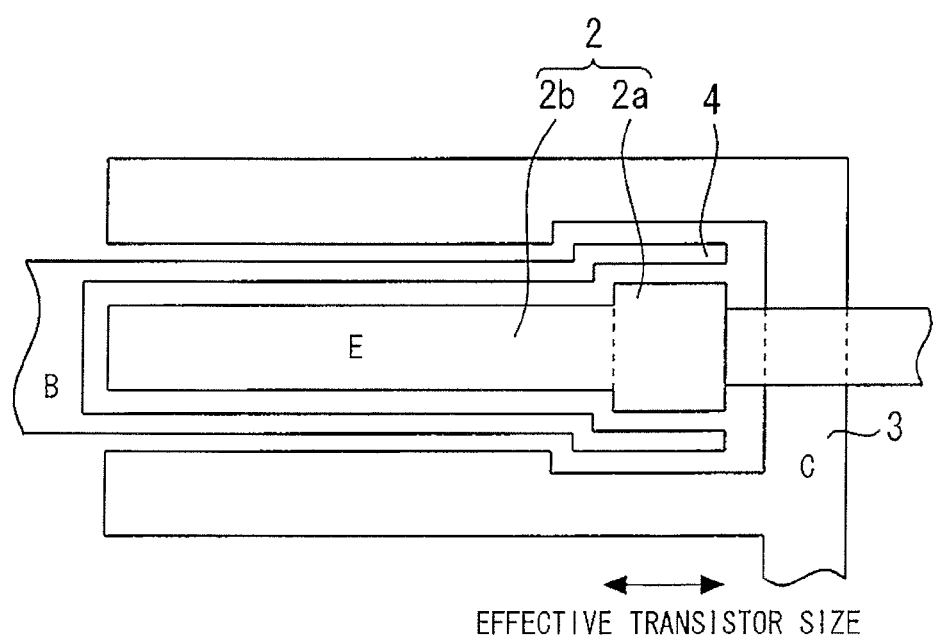
FIG. 13 is a top view showing a transistor according to a sixth embodiment of the present invention.

FIG. 13 is a top view showing a transistor according to a sixth embodiment of the present invention. The sixth embodiment includes making the portion 2a of the emitter electrode 2 wider than the portion 2b instead of providing the heat sink plate according to one of the first to fifth embodiments. At the portion 2a defining a larger emitter size, a larger collector current flows, so that increase of heat can occur comparatively easily. The breakdown voltage can therefore be increased, as in the first embodiment.

Seventh Embodiment

Figure 14:
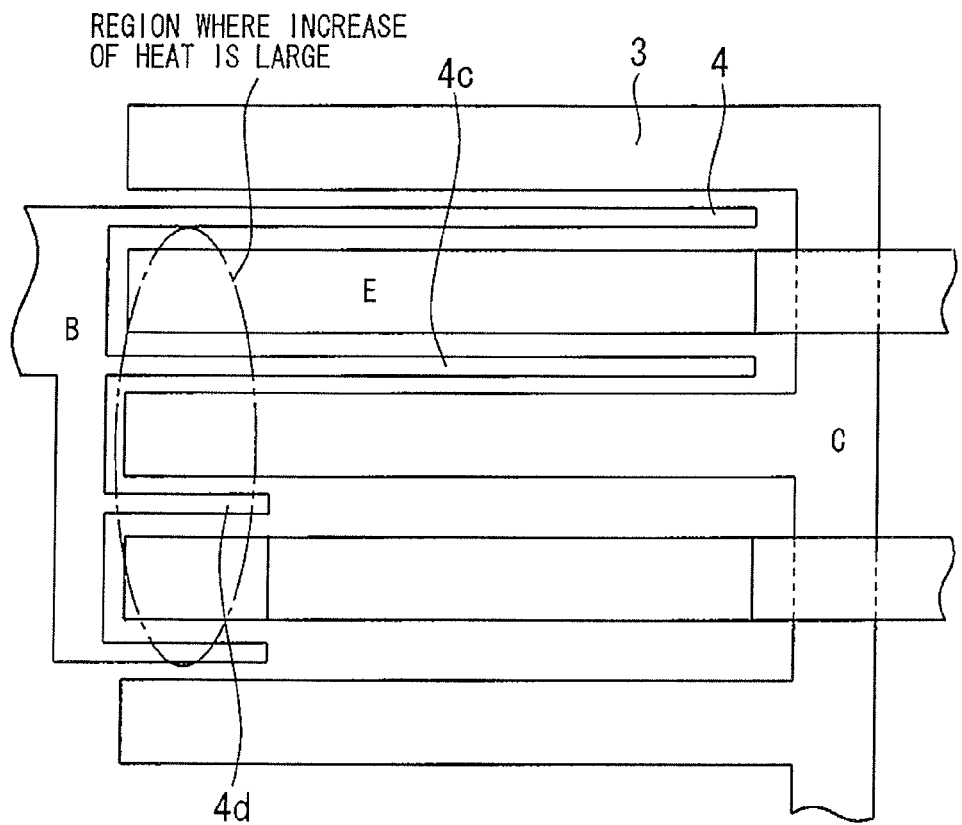
FIG. 14 is a top view showing a transistor according to a seventh embodiment of the present invention.
Figure 15:
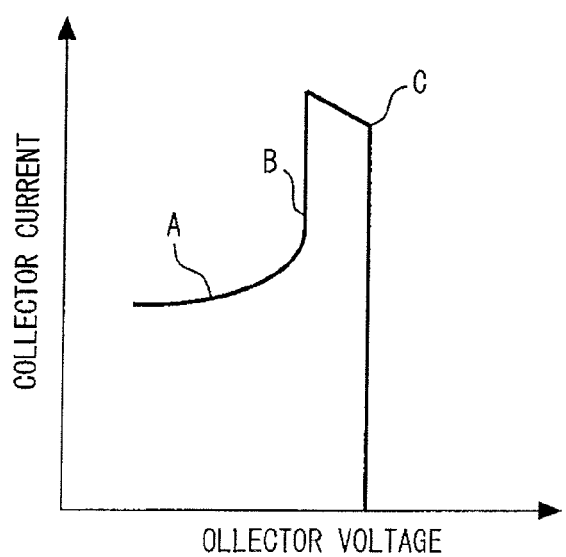
FIG. 15 is a diagram showing the relationship between the collector current and the collector voltage of a conventional transistor.

FIG. 14 is a top view showing a transistor according to a seventh embodiment of the present invention. A plurality of emitter electrodes 2 are disposed parallel to each other. A plurality of collector electrodes 3 are disposed parallel so as to interdigitate with the plurality of emitter electrodes 2. A plurality of base electrodes 4c and 4d are disposed between the emitter electrodes 2 and the collector electrodes 3. The base electrode 4d is disposed adjacent to the base electrode 4c and is shorter than the base electrode 4c.

A smaller transistor is disposed adjacent to a long finger in this way. In a region along the side of the small transistor, the increase of heat is larger, so that the temperature is locally increased. The breakdown voltage can therefore be increased, as in the first embodiment.

If in any one of the fourth to seventh embodiments a resistance is provided between the portion of the emitter electrode 2 or the base electrode 4c at which the increase of heat is large and the portion of the emitter electrode 2 or the base electrode 4c at which the increase of heat is small, the same effect as that of the second or third embodiment can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-085642, filed on Apr. 4, 2012, including specification, claims, drawings, and summary, on which the Convention priority of the present application is based, is incorporated herein by reference in its entirety.

What is claimed is:

1. A transistor comprising:
a semiconductor substrate;
a first electrode on the semiconductor substrate and having first and second portions;
a second electrode on the semiconductor substrate and spaced apart from the first electrode;
a control electrode on the semiconductor substrate and disposed between the first electrode and the second electrode;
a first heat sink plate joined to the second portion of the first electrode without being joined to the first portion of the first electrode; and
a first resistor located between the first portion of the first electrode and the second portion of the first electrode.

2. The transistor according to claim 1, wherein the first heat sink plate is joined to the semiconductor substrate outside a region where the first electrode, the second electrode, and the control electrode are present.

3. The transistor according to claim 1, wherein the first portion of the first electrode is located at an end portion of the first electrode.

4. A transistor comprising:
a semiconductor substrate;
a first electrode on the semiconductor substrate and having first and second portions;
a second electrode on the semiconductor substrate and spaced apart from the first electrode;
a control electrode on the semiconductor substrate and disposed between the first electrode and the second electrode; and
a first heat sink plate joined to the second portion of the first electrode without being joined to the first portion of the first electrode, wherein
the control electrode includes a first portion opposite the first portion of the first electrode, and a second portion opposite the second portion of the first electrode, and the transistor further comprises a second resistor located between the first portion of the control electrode and the second portion of the control electrode.

5. The transistor according to claim 4, wherein the first heat sink plate is joined to the semiconductor substrate outside a region where the first electrode, the second electrode, and the control electrode are present.

6. The transistor according to claim 4, wherein the first portion of the first electrode is located at an end portion of the first electrode.

7. A transistor comprising:
a semiconductor substrate;
a first electrode on the semiconductor substrate and having first and second portions;
a second electrode on the semiconductor substrate and spaced apart from the first electrode;
a control electrode on the semiconductor substrate and disposed between the first electrode and the second electrode;
a first heat sink plate joined to the second portion of the first electrode without being joined to the first portion of the first electrode; and
a second heat sink plate joined to the first portion of the first electrode without being joined to the second portion of the first electrode, and heat-releasing performance of the second heat sink plate is lower than heat-releasing performance of the first heat sink plate.

8. The transistor according to claim 7, wherein the first heat sink plate is joined to the semiconductor substrate outside a region where the first electrode, the second electrode, and the control electrode are present.

9. The transistor according to claim 7, wherein the first portion of the first electrode is located at an end portion of the first electrode.

10. A transistor comprising:
a semiconductor substrate;
a first electrode on the semiconductor substrate and having first and second portions;
a second electrode on the semiconductor substrate and spaced apart from the first electrode;
a control electrode on the semiconductor substrate and disposed between the first electrode and the second electrode;
a first heat sink plate joined to the second portion of the first electrode without being joined to the first portion of the first electrode; and
a high-thermal-resistance film located between the first portion of the first electrode and the first heat sink plate and having a thermal resistance higher than thermal resistances of the first electrode and the first heat sink plate.

11. The transistor according to claim 10, wherein the first heat sink plate is joined to the semiconductor substrate outside a region where the first electrode, the second electrode, and the control electrode are present.

12. The transistor according to claim 10, wherein the first portion of the first electrode is located at an end portion of the first electrode.

* * * * *